United States Patent
Wang et al.

(10) Patent No.: US 12,224,246 B2
(45) Date of Patent: Feb. 11, 2025

(54) FLEXIBLE HYBRID ELECTRONIC SYSTEM PROCESSING METHOD AND FLEXIBLE HYBRID ELECTRONIC SYSTEM

(71) Applicant: PEKING UNIVERSITY, Beijing (CN)

(72) Inventors: Wei Wang, Beijing (CN); Lang Chen, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 415 days.

(21) Appl. No.: 17/763,217

(22) PCT Filed: Apr. 30, 2021

(86) PCT No.: PCT/CN2021/091483
§ 371 (c)(1),
(2) Date: Mar. 24, 2022

(87) PCT Pub. No.: WO2022/183584
PCT Pub. Date: Sep. 9, 2022

(65) Prior Publication Data
US 2023/0170307 A1    Jun. 1, 2023

(30) Foreign Application Priority Data

Mar. 1, 2021 (CN) .......................... 202110224990.7

(51) Int. Cl.
*H01L 23/538* (2006.01)
*H01L 21/48* (2006.01)
(Continued)

(52) U.S. Cl.
CPC ........ *H01L 23/5387* (2013.01); *H01L 21/481* (2013.01); *H01L 21/568* (2013.01); *H01L 24/83* (2013.01); *H01L 2224/83203* (2013.01)

(58) Field of Classification Search
CPC . H01L 23/5387; H01L 21/481; H01L 21/568; H01L 24/83; H01L 2224/83203;
(Continued)

(56) References Cited

U.S. PATENT DOCUMENTS

2018/0182727 A1 *  6/2018  Yu ........................... H01L 24/20

FOREIGN PATENT DOCUMENTS

| CN | 104103528 A | * 10/2014 | ............. H01L 24/19 |
| CN | 108996464 A | 12/2018 | |

(Continued)

*Primary Examiner* — Douglas W Owens
(74) *Attorney, Agent, or Firm* — Bayramoglu Law Offices LLC (57) ABSTRACT

A processing method of a flexible hybrid electronic system is provided and includes the following steps: etching out embedded grooves on a front surface of a silicon-based substrate embedding a plurality of heterogeneous chips into corresponding embedded grooves, wherein front surfaces of the embedded chips are flush with the front surface of the silicon-based substrate; then gradually realize the polymer flexible connection, electrical interconnection, insulation protection, and polymer flexible coverage between chips. The processing method processes the flexible hybrid electronic system based on the method of embedding chips, which can reduce material loss and processing steps, and is beneficial to realizing large-scale manufacturing.

14 Claims, 5 Drawing Sheets

(51) Int. Cl.
*H01L 21/56* (2006.01)
*H01L 23/00* (2006.01)

(58) Field of Classification Search
CPC .... H01L 23/5389; H05K 1/185; H05K 1/189; Y02E 10/549; Y02E 70/50; H10K 71/00; H10K 71/80; H10K 77/111
See application file for complete search history.

(56) References Cited

FOREIGN PATENT DOCUMENTS

| | | | | |
|---|---|---|---|---|
| CN | 110310895 A | 10/2019 | | |
| CN | 110491853 A | 11/2019 | | |
| CN | 111613579 A | 9/2020 | | |
| CN | 111717885 A | 9/2020 | | |
| WO | WO-2017024892 A1 * | 2/2017 | ............. | H01L 21/56 |
| WO | 2017045422 A1 | 3/2017 | | |

* cited by examiner

FLEXIBLE HYBRID ELECTRONIC SYSTEM PROCESSING METHOD AND FLEXIBLE HYBRID ELECTRONIC SYSTEM

CROSS REFERENCE TO THE RELATED APPLICATIONS

This application is the national phase entry of International Application No. PCT/CN2021/091483, filed on Apr. 30, 2021, which is based upon and claims priority to Chinese Patent Application No. 202110224990.7, filed on Mar. 1, 2021, the entire contents of which are incorporated herein by reference.

TECHNICAL FIELD

The present disclosure relates to the technical field of microscopic structure system, and in particularly relates to a processing method of a flexible hybrid electronic system and a flexible hybrid electronic system.

BACKGROUND

The flexible hybrid electronic system is an electronic system that integrates different material systems and different functional units. Electronic products based on the flexible hybrid electronic system can be stretched, compressed, twisted and bent into irregular shapes without affecting the function. With the rapid development of intelligent new technologies such as wearable, implantable and human-computer interaction, the application prospects of the flexible hybrid electronic system are gradually becoming clear.

At present, common preparation methods of the flexible hybrid electronic system include an organic material printing, an inorganic material flexibility and a structural design. Among them, the method of the structural design is to combine rigid materials and flexible materials into a special structure, to obtain a flexible hybrid electronic system that is compressible and bendable without fission. Compared with the preparation methods of the organic material printing and the inorganic material flexibility, the flexible hybrid electronic system using the structural design can have both high electrical properties and physical structure deformability.

For the flexible hybrid electronic system with the structural design, it is necessary to provide a processing method that can adapt to integrated processing of heterogeneous chips with different materials, different tape out batches, different sizes and different thicknesses under the premise of ensuring the electrical performance, reliability and flexibility of the flexible hybrid electronic system, and realize large-scale manufacturing.

SUMMARY

In view of the above problems, the embodiments of the present disclosure provide a processing method of a flexible hybrid electronic system and a flexible hybrid electronic system that overcome the above problems or at least partially solve the above problems.

In order to solve the above problems, the embodiment of the present disclosure provides a processing method of a flexible hybrid electronic system, the method includes:

step 1: etching out embedded grooves corresponding to a plurality of chips in size on a front surface of a silicon-based substrate;

step 2: by using chip adhesive glues or chip adhesive films, embedding and gluing the plurality of chips into corresponding embedded grooves, wherein front surfaces of the plurality of embedded chips are flush or nearly flush with the front surface of the silicon-based substrate;

step 3: etching and filling polymers on a front surface of a silicon-connection structure between each embedded chip, to realize flexible connections among the plurality of chips;

step 4: polishing surfaces of structures filled with the polymers, to obtain flat surfaces;

step 5: obtaining a metal wire between each chip from the flat surfaces of the structures filled with the polymers, to realize an electrical interconnection between each chip;

step 6: covering polymers on surfaces of structures which complete the electrical interconnections, to realize insulation protection of the electrical interconnections;

step 7: thinning from back surfaces of structures which complete the insulation protection until the chip adhesive glues or the chip adhesive films of the plurality of chips are exposed; and step 8: covering polymers on back surfaces of thinned structures, to perform flexible protection.

Optionally, the step 1 specifically includes:

according to sizes of the plurality of chips to be embedded, photolithographically etching out patterns on the front surface of the silicon-based substrate for embedding the plurality of chips; and by using a mixed etching with reactive ion etching (RIE) and high ratio machining (HRM), according to thicknesses of the plurality of thinned chips, etching the patterns to obtain the embedded grooves corresponding to the sizes and the thicknesses of the plurality of chips.

Optionally, in the step 2, by using the chip adhesive glues or the chip adhesive films, embedding and gluing the plurality of chips into the corresponding embedded grooves, includes:

by using a glue dispenser, dropping the chip adhesive glues in the center of the embedded grooves, or, attaching the chip adhesive films on back surfaces of the plurality of chips; and by using a submicron mounter with a thermocompression bonding method, embedding and gluing the plurality of chips into the corresponding embedded grooves with the chip adhesive glues dropped in the center, or, embedding and gluing the plurality of chips with the chip adhesive films attached on the back surfaces into the corresponding embedded grooves.

Optionally, by using the submicron mounter with the thermocompression bonding method, embedding and gluing the plurality of chips into the corresponding embedded grooves with the chip adhesive glues dropped in the center, or, embedding and gluing the plurality of chips with the chip adhesive films attached on the back surfaces into the corresponding embedded grooves, includes:

by using the submicron mounter, picking up and vacuum sucking the plurality of chips or the plurality of chips with the chip adhesive films attached on the back surfaces, and visual positioning into the corresponding embedded grooves; and heating a heating head of the submicron mounter to a patch temperature and applying a certain amount of pressure for a period of time, solidifying the chip adhesive glues or the chip adhesive films between the plurality of chips and the silicon-based substrate, and embedding and gluing the plurality of chips into the corresponding embedded grooves with the chip adhesive glues dropped in the center, or, embedding and gluing the plurality of chips with the chip adhesive films attached on the back surfaces into the corresponding embedded grooves.

Optionally, the step 3 includes:

etching out a plurality of microgrooves on the front surface of the silicon-connection structure between each embedded chip;

filling the polymers on front surface of each embedded chip and interiors of the plurality of microgrooves;

etching away the polymers on the front surface of the silicon-based substrate with each chip embedded, until silicon column structures among the plurality of microgrooves are exposed;

removing the silicon column structures among the plurality of microgrooves; and filling the polymers again, to realize the flexible connections among the plurality of chips.

Optionally, etching out the plurality of microgrooves on the front surface of the silicon-connection structure between each embedded chip includes:

on the front surface of the silicon-connection structure between each embedded chip, by using a mixed etching with RIF, and HRM, etching out the plurality of microgrooves with a width of 10 μm, an adjustable depth and a high aspect ratio.

Optionally, etching away the polymers on the front surface of the silicon-based substrate with each chip embedded includes:

by using oxygen plasmas, etching away the redundant polymers on the front surface of the silicon-based substrate with each chip embedded.

Optionally, removing the silicon column structures among the plurality of microgrooves includes:

by using a method of photolithography first and then HRM etching, removing the silicon column structures among the plurality of microgrooves.

Optionally, the step 4 specifically includes:

by using a method of polishing with polishing liquids and polishing cloths, polishing the surfaces of the structures filled with the polymers to obtain the flat surfaces.

Optionally, the step 5 includes:

etching the flat surfaces of the structures filled with the polymers, to etch out an interconnection pin between each chip;

by using an image recognition technology, drawing an interconnection line between each interconnection pin;

photolithographically etching out the interconnection line between each interconnection pin by using a laser direct writing lithography machine, and sputtering an interconnection metal layer; and removing photoresists by using a metal stripping process, and obtaining the metal wire between each chip, to realize the electrical interconnection between each chip.

Optionally, etching the flat surfaces of the structures filled with the polymers, to etch out the interconnection pin between each chip, includes:

by using the image recognition technology, calculating automatically inclination angles between the plurality of chips;

according to the inclination angles, performing photolithography on the flat surfaces of the structures filled with the polymers, to photolithographically etching out surface positions corresponding to the interconnection pins; and by using an oxygen plasma etching, on the surface positions corresponding to the interconnection pins, deep etching the filled polymers until the interconnection pin between each chip is exposed.

Optionally, after the step 4 and before the step 5, the method further includes:

step 4': thinning structures with flat surfaces, to facilitate the subsequent use of the step 5 to realize the electrical interconnection between each chip.

The embodiment of the present disclosure further provides a flexible hybrid electronic system, the flexible hybrid electronic system is processed according to the processing method described by any one of the above embodiments, a plurality of heterogeneous chips are distributed in the flexible hybrid electronic system, each of the plurality of heterogeneous chips is in the electrical interconnection, and each of the plurality of heterogeneous chips is in connection by using the polymers as flexible structures.

It can be seen from the above technical solutions that the embodiments of the present disclosure provide a processing method of a flexible hybrid electronic system and a flexible hybrid electronic system. In the method, a silicon-based substrate is used as a processing carrier, a plurality of chips are bonded and embedded on one side of the silicon-based substrate, the silicon-based substrate is removed layer by layer, and flexible polymers are prepared layer by layer, and on this basis, the electrical interconnection between each chip is realized, finally the electrical interconnection between chips is wrapped by flexible polymer, which can be compatible with all kinds of heterogeneous chips, complete the processing of the flexible hybrid electronic system based on the structural design with as little material loss and process steps as possible, and be beneficial to realize the large-scale manufacturing of the flexible hybrid electronic system.

The above description is merely a summary of the technical solutions of the present disclosure. In order to more clearly know the elements of the present disclosure to enable the implementation according to the contents of the description, and in order to make the above and other purposes, features, and advantages of the present disclosure more apparent and understandable, the particular embodiments of the present disclosure are provided below.

DETAILED DESCRIPTION OF THE EMBODIMENTS

In order to make the objects, the technical solutions, and the advantages of the embodiments of the present disclosure clearer, the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

The flexible hybrid electronic system may be regarded as a circuit that includes a flexible substrate, printed functions, and externally fabricated ICs. In a word, it is to achieve the flexibility of integrated circuits. However, existing integrated circuits are generally printed based on rigid inorganic materials, for example, integrated circuits are printed on silicon-based substrate materials. Based on this, several technical solutions for realizing the flexible hybrid electronic system are proposed in the related art.

Wherein, the first technical solution is to directly use special flexible organic materials, such as nanomaterials, liquid metals and conductive polymers, as the carrier of the integrated circuit. Correspondingly, the preparation method is to print the integrated circuit directly on the surface of the flexible organic material, to obtain this flexible hybrid electronic system. Due to the excellent ductility of these special flexible organic materials, the flexible hybrid electronic system can be realized without special flexibility process during the processing. However, the carrier mobility of the organic materials itself is not high, so the prepared flexible electronic circuit has limited performance.

The second technical solution is to make inorganic materials flexible, and then combine the organic materials to realize the flexible hybrid electronic system. The preparation method is to transfer ultra-thin inorganic materials to flexible or elastic substrates, to realize the flexibility of inorganic semiconductor materials and the entire hybrid electronic system. Compared with the first technical solution, although the technical solution based on the ultra-thin inorganic materials can improve the performance of the flexible hybrid electronic system, the ultra-thin inorganic material substrate will have mechanical problems of interface failure and fracture. Also, the preparation and transfer of the ultra-thin inorganic materials rely on printing and transfer technology, and it is currently difficult to achieve large-scale manufacturing.

While the third technical solution is to realize the flexible hybrid electronic system using the combine of rigid materials and flexible materials by the structured design, that is, printing the integrated circuit on the rigid materials, and then connecting the rigid materials with the flexible materials to realize the flexibility of the entire hybrid electronic systems. Specifically, the structural designs used by the flexible hybrid electronic system include waveforms, biaxial waves, serpentines, origami and kirigami. Compared with the previous two technical solutions, the flexible hybrid electronic system based on the structured design retains the electrical properties of the integrated circuit on the inorganic materials, and after the physical structure undergoes a series of extensional deformations including stretching, bending, folding and torsion, the electrical structure is hardly damaged, and the electrical properties of the integrated circuit can be largely preserved.

Obviously, the flexible hybrid electronic system based on the structural design have advantages in many aspects, but the current processing methods of the flexible hybrid electronic system are not mature enough to achieve large-scale manufacturing. Therefore, for the flexible hybrid electronic system with the structural design, the embodiment of the present disclosure provides a processing method of a flexible hybrid electronic system and a flexible hybrid electronic system, the method can adapt to the heterogeneous chips with different materials, different tape out batches, different sizes and different thicknesses, complete the integrated processing of the plurality of chips in the flexible materials, and minimize process material loss and process steps to realize large-scale manufacturing of the flexible hybrid electronic system with high reliability and high flexibility.

Figure 1:
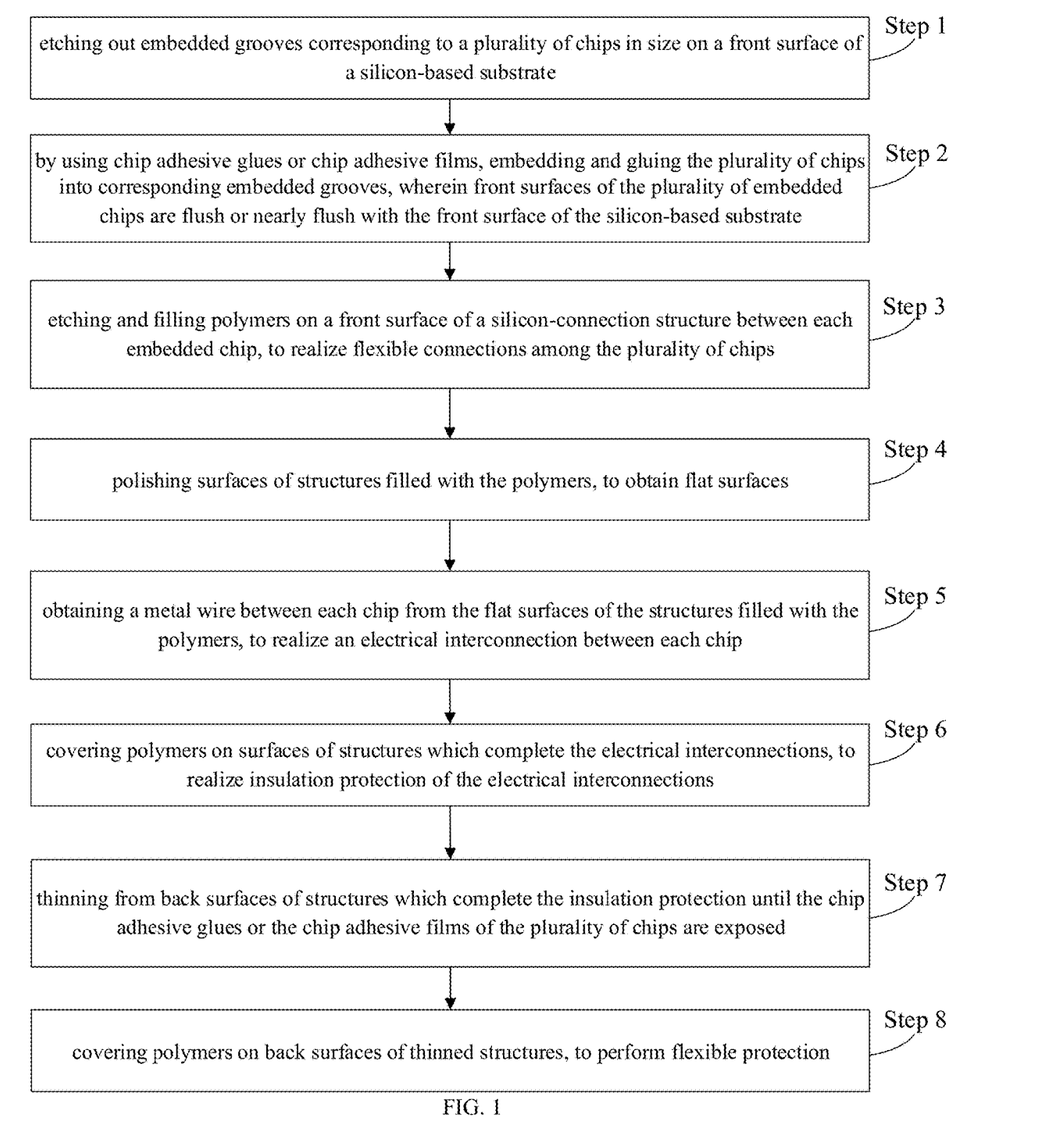
FIG. 1 illustrates a step flow chart of a processing method of a flexible hybrid electronic system according to the present disclosure.

Referring, to FIG. 1, FIG. 1 illustrates a step flow chart of a processing method of a flexible hybrid electronic system according, to the present disclosure. As shown in FIG. 1, the method specifically includes the following steps:

step 1: etching out embedded grooves corresponding to a plurality of chips in size on a front surface of a silicon-based substrate.

Figure 2:
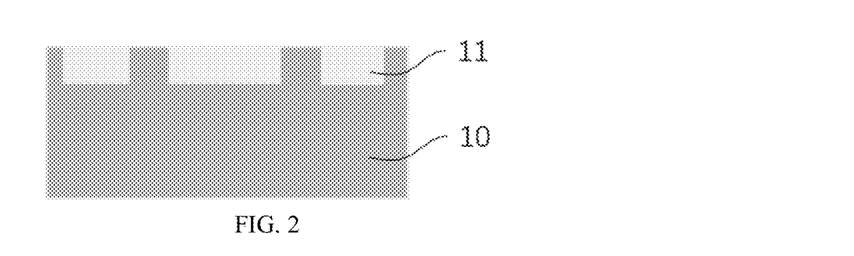
FIG. 2 illustrates a cross-section schematic diagram of embedded grooves of a silicon-based substrate during the implementation of the method according to the present disclosure.

Referring to FIG. 2, FIG. 2 illustrates a cross-section schematic diagram of embedded grooves of a silicon-based substrate during the implementation of the method according to the present disclosure. As shown in FIG. 2, on the front surface of the silicon-based substrate 10, a size and a depth of each embedded groove 11 may be equal or unequal, which is determined according to the size of each corresponding chip. Among them, a length, a width and a height of each embedded groove may be consistent with a length, a width and a height of the corresponding chip, that is, the size and the thickness are equal.

Wherein, the plurality of chips are heterogeneous chips which are prepared by using different materials with different tape out batches and have any size and any thickness. The heterogeneous chips are chips with different materials and different process structures.

Considering that the circuit is generally only printed on the front surface of the chip, the thinning of the substrate material does not affect the function of the chip. Therefore, in the embodiment of the present disclosure, before the step 1, the chip structure can be thinned from the back side of the chip, and the thickness of the thinned chip is equal to a preset thickness value, so that the thickness of the overall structure of the final processed flexible hybrid electronic system is reduced, and the consistent thickness of the plurality of chips also facilitates the fabrication of interconnect pins and metal wires in subsequent steps.

In this embodiment, the chip structure may be thinned by means of mechanical grinding. Illustratively, the thickness of all chips may be thinned to 50 μm.

Considering the processing error, in order to avoid that the chip cannot be smoothly bonded with the embedded groove in the subsequent steps, in an optional embodiment, the size of the embedded groove may also be slightly larger than the size of the chip, so that the depth of the embedded groove is equal to the sum of the thickness of the thinned chip and the thickness of the chip adhesive film, or, the depth of the embedded groove is equal to the sum of the thickness of the thinned chip and the thickness of the solidified chip adhesive glue. Exemplarily, if the size of the thinned chip is 1000 μm×1000 μm×50, and the thickness of the chip adhesive film or the thickness of the chip adhesive glue is 10 μm, the size of the embedded groove may be 1010 μm×1010 μm×60 μm.

Optionally, a pattern may be engraved on the front surface of the silicon-based substrate first, and then each embedded groove may be etched out according to the engraved pattern, to improve the processing efficiency. And the embodiment of the present disclosure provides a method for etching embedded grooves, the method specifically includes:

step 101, according to sizes of the plurality of chips to be embedded, photolithographically etching out patterns on the front surface of the silicon-based substrate for embedding the plurality of chips.

Wherein, since the pattern is only a visible notch on the front surface of the silicon-based substrate, in this embodiment, a photolithography machine may be used to perform photolithography of the pattern.

Step 102, by using a mixed etching with RIE and HRM, according to thicknesses of the plurality of thinned chips, etching the patterns to obtain the embedded grooves corresponding to the sizes and the thicknesses of the plurality of chips.

Due to the depth of the embedded groove needs to be consistent with the thickness of the chip, a large amount of material processing is involved, Therefore, in this embodiment, the embedded groove is processed by the mixed etching with RIE and HRM: RIE, as a traditional dry etching technology, uses molecular gas plasma for etching in a vacuum system, which can complete the etching of the surface silicon-based material where the embedded groove is located, but the RIE etching technology cannot obtain a high selectivity ratio, and the surface of the processed material is damaged and polluted, and the processing precision is not high, After the surface or shallow layer is etched by RIE, then HRM etching is performed. Among them, the HRM directly etches the polymer material by the induction shed plasma, which has a larger anisotropic etching rate ratio and a higher etching rate, and can more easily obtain a silicon-based groove structure with a high aspect ratio and realize the structural processing with higher-precision.

Step 2: by using chip adhesive glues or chip adhesive films, embedding and gluing the plurality of chips into corresponding embedded grooves, wherein front surfaces of the plurality of embedded chips are flush or nearly flush with the front surface of the silicon-based substrate.

In an optional implementation, the step 2 includes:

step 201, by using a glue dispenser, dropping the chip adhesive glues in the center of the embedded grooves, or, attaching the chip adhesive films on back surfaces of the plurality of chips.

Step 202, by using a submicron mounter with a thermocompression bonding method, embedding and gluing the plurality of chips into the corresponding embedded grooves with the chip adhesive glues dropped in the center, or, embedding and gluing the plurality of chips with the chip adhesive films attached on the back surfaces into the corresponding embedded grooves.

Specifically, the glue dispenser may be used to quantitatively drop the chip adhesive glue in the center of the embedded groove, and dry the chip adhesive glue at a certain temperature and for a certain period. Wherein the amount of the chip adhesive glue meets the following conditions: after the plurality of chips are embedded into the corresponding embedded grooves with the chip adhesive glue dropped in the center, the thickness of the solidified chip adhesive glue may be 10 μm.

Figure 3:
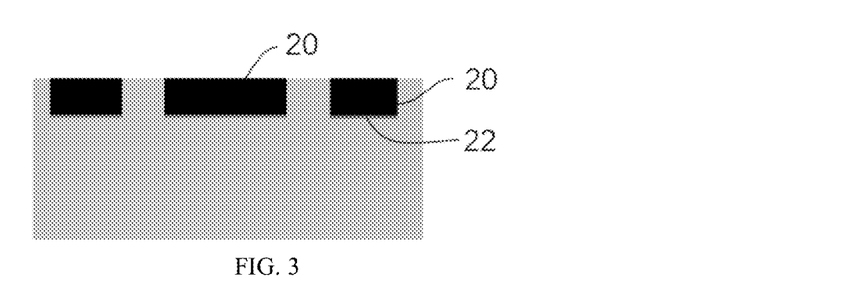
FIG. 3 illustrates a cross-section schematic diagram of a bonding of chips and embedded grooves during the implementation of the method according to the present disclosure.

Referring to FIG. 3, FIG. 3 illustrates a cross-section schematic diagram of a bonding of chips and embedded grooves during the implementation of the method according to the present disclosure. As shown in FIG. 3, in order to facilitate the electrical interconnection between the plurality of chips 20 in the subsequent steps, in this embodiment, the size of the etched embedded groove corresponds to the size of the chip, so that the chip may be completely bonded to the bottom of the embedded groove from the back suffice, to form a bonding surface 22 of the chip and the embedded groove. Then, the front surface of the chip is flush with the front surface of the silicon-based substrate, that is, the front surfaces of all chips are in the same plane, so the pins on the front surfaces of all chips are also in the same plane, which makes it easier for each chip to complete the electrical interconnection through the pins on the front surfaces.

In the embodiment, the hack surface of the chip and the bottom of the embedded groove may be bonded by the chip adhesive glue or the chip adhesive film. Among them, the chip adhesive film, that is, the DAF (Die Attach Film) film, the chip adhesive film usually has a fixed thickness, such as 10 μm, 20 μm, and so on. Exemplarily, in this embodiment, the chip adhesive film with the thickness of 10 μm is used.

Specifically, the chip adhesive film may also be attached to the hack surfaces of the plurality of thinned chips at the same time, and then according to the shapes and outlines of the chips, the chip adhesive film may be laser cut, and the plurality of chips separated by the laser cutting are thermocompression bonded into the embedded grooves, to improve the efficiency of chip bonding and embedding.

In the embodiment, by using a submicron mounter with a thermocompression bonding method, embedding the plurality of chips into the corresponding embedded grooves, specifically includes the following steps:

step 2021, by using the submicron mounter, picking up and vacuum sucking the plurality of chips or the plurality of chips with the chip adhesive films attached on the back surfaces, and visual positioning into the corresponding embedded grooves.

Step 2022, heating a heating head of the submicron mounter to a patch temperature and applying a certain amount of pressure for a period of time, solidifying the chip adhesive glues or the chip adhesive films between the plurality of chips and the silicon-based substrate, and embedding and gluing the plurality of chips into the corresponding embedded grooves with the chip adhesive glues dropped in the center, or, embedding and gluing the plurality of chips with the chip adhesive films attached on the back surfaces into the corresponding embedded grooves.

Wherein, by using the submicron mounter, according to the preset temperature gradient, and by means of constant temperature heating through vacuum nozzles, the chip may be heated to a preset bonding temperature, that is, the temperature at which the chip adhesive glue or the chip adhesive film is solidified, to dry and solidify the chip adhesive glue or the chip adhesive film.

This embodiment uses the submicron mounter, with preset patch temperature, pressure and holding time, so that each chip may be closely bonded to the bottom of the embedded groove of the silicon-based substrate through the chip adhesive glue or the chip adhesive film, and the embedded groove itself may also play the role of auxiliary positioning for the bonding, which can enhance the bonding effect, and prevent the chip from shifting and falling off.

Step 3: etching and filling polymers on a front surface of a silicon-connection structure between each embedded chip, to realize flexible connections among the plurality of chips.

After the step 2, the embodiment of the present disclosure considers removing the silicon-based substrate material between each chip, and preparing a flexible polymer to realize a preliminary flexible connection between each chip. Considering the high brittleness of the silicon-based materials, if all the connection materials between the chips are directly removed, there will be a risk of damage to the silicon-based structure, and if the polymers are directly filled in the grooves dug out between the chips, it is also easy to cause voids, air bubbles, etc. in the polymers because that the groove gap is too large, and a tight flexible connection cannot be formed. Since the deposition of the polymer using Parylene as an example has a high shape retention, after filling the overly wide groove, the polymer formed in the groove will retain the shape of the groove, which is not conducive to the subsequent process. Therefore, in this embodiment, the wider embedded grooves are divided into a plurality of parallel microgrooves with high aspect ratio during the processing, and the polymer filling is divided into two separate preparations, rather than one preparation. Wherein, the high aspect ratio means that the ratio of the depth to the width of the microgroove is not less than 4 times, so that the prepared polymer can more closely fill the microgroove.

Therefore, in the embodiment of the present disclosure, the polymer filled inside the microgroove is prepared first, that is, half of the polymer between each chip is prepared first, and then the remaining half of the polymer is prepared. Specifically, in the embodiment of the present disclosure, the following method is used to prepare the polymer between the chips to form the preliminary flexible connection, which specifically includes:

step 301, etching out a plurality of microgrooves on the front surface of the silicon-connection structure between each embedded chip.

Step 302, filling the polymers on front surface of each embedded chip and interiors of the plurality of microgrooves.

Step 303, etching away the polymers on the front surface of the silicon-based substrate with each chip embedded, until silicon column structures among the plurality of microgrooves are exposed.

Step 304, removing the silicon column structures among the plurality of microgrooves.

Step 305, filling the polymers again, to realize the flexible connections among the plurality of chips.

Wherein, the silicon-connection structure is a silicon-based substrate structure between each chip. The polymer material may be PI (Polyimide) or Parylene (a novel thermoplastic polymer material of parylene), which is prepared on the structure to be processed by CVD (Chemical Vapor Deposition) or spin coating. For example, inside the plurality of microgrooves or on the front surface of a chip.

Figure 4:
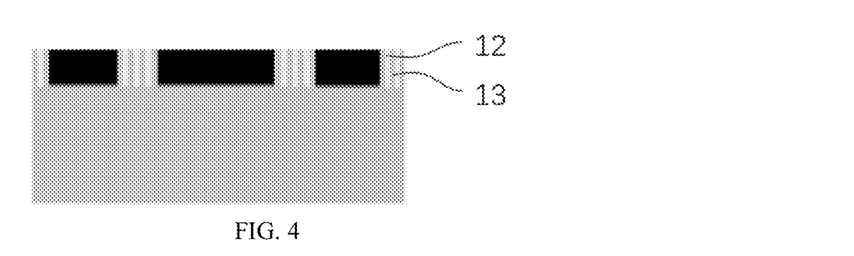
FIG. 4 illustrates a cross-section schematic diagram of a microgroove during the implementation of the method according to the present disclosure.

Referring to FIG. 4, FIG. 4 illustrates a cross-section schematic diagram of a microgroove during the implementation of the method according to the present disclosure. As shown in FIG. 4, in this embodiment, the silicon-connection structures between the chips are first etched, to obtain a plurality of parallel microgrooves 12 and a plurality of parallel silicon column structures 13 constituting the microgroove.

In this embodiment, by using a mixed etching with RIE and HRM, on the front surface of the silicon-connection structure between each embedded chip, etching out the plurality of microgrooves with a high aspect ratio, specifically including:

On the front surface of the silicon-connection structure between each embedded chip, the plurality of microgrooves with a width of 10 μm, an adjustable depth and a high aspect ratio are etched by the mixed etching with RIE and HRM. Exemplarily, according to that the thickness of the thinned chip is 50 μm, the depth of the microgroove may be set to 60 μm to make room for glue or adhesive film. As shown in FIG. 2 and FIG. 4, the depth of microgroove 12 may be consistent with the depth of the embedded groove 11.

Figure 5:
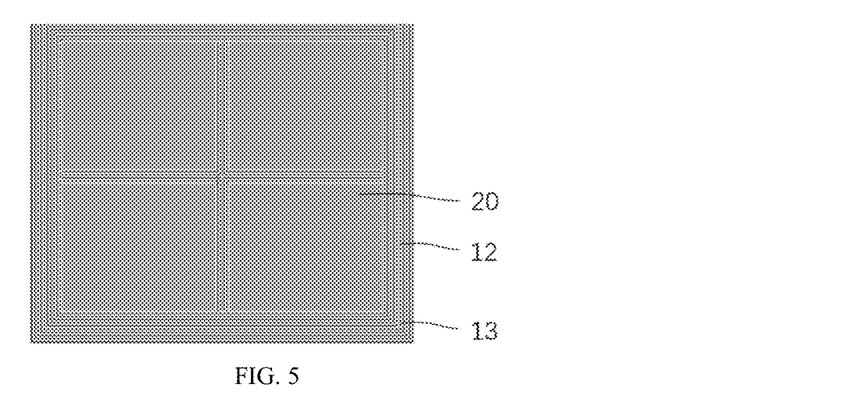
FIG. 5 illustrates a top view schematic diagram of a microgroove during the implementation of the method according to the present disclosure.

Referring to FIG. 5, FIG. 5 illustrates a top view schematic diagram of a microgroove during the implementation of the method according to the present disclosure. As shown in FIG. 5, the plurality of microgrooves 12 surround the chip 20, which are a plurality of grooves parallel to the adjacent microgroove, and a plurality of parallel silicon column structures are regarded as groove walls, which can provide a larger adhesion surface for polymer deposition, thereby improving polymer preparation efficiency. Among them, for the convenience of presentation, the chips 20 shown in FIG. 5 are chips with the same size. When the chips 20 are chips with different sizes, this embodiment may also perform processing by the microgrooves shown in FIG. 5 to prepare the flexible polymers twice.

Figure 6:
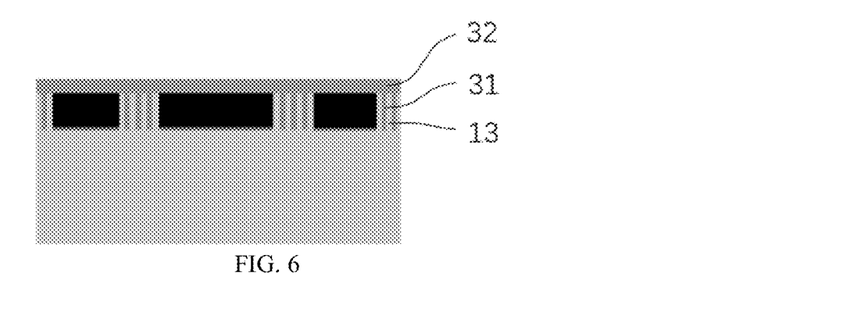
FIG. 6 illustrates a cross-section schematic diagram of a polymer filled inside a microgroove during the implementation of the method according to the present disclosure.

Referring to FIG. 6, FIG. 6 illustrates a cross-section schematic diagram of a polymer filled inside a microgroove during the implementation of the method according to the present disclosure. As shown in FIG. 6, the polymers 31 filled inside the microgrooves may tightly fill the plurality of microgrooves with the high aspect ratio, and due to the limitation of the CVD or spin coating process, during the preparation of the polymer filled inside the microgroove, the polymer is formed on the front surface of the silicon-based substrate of each chip, that is, the polymer 32 on the front surface of the silicon-based substrate.

Wherein, the thickness of the polymer 32 on the front surface of the silicon-based substrate may be adjusted according to the groove width of the microgroove. Illustratively, it may be 10 μm.

In order to remove the remaining silicon-based materials between the chips and fill the polymer, in this embodiment, it also needs to etch and remove the polymer 32 on the front surface of the silicon-based substrate, so that the silicon column structure 13 is visually visible from the front side, so that the device can remove by etching. Since the silicon column structure 13 is used as a parallel trench wall with a continuous structure, it is also advantageous to be removed by etching.

Figure 7:
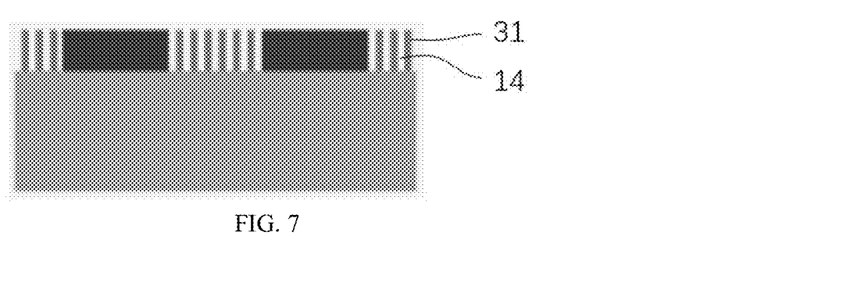
FIG. 7 illustrates a cross-section schematic diagram after removing silicon column structures during the implementation of the method according to the present disclosure.

Referring to FIG. 7, FIG. 7 illustrates a cross-section schematic diagram after removing silicon column structures during the implementation of the method according to the present disclosure. As shown in FIG. 7, after the silicon column structures are removed, only the polymers 31 filled inside the original microgrooves are remained between the chips, and new microgrooves are formed between the polymers 31 filled inside the microgrooves, that is, the microgrooves 14 composed of the polymers.

Next, continue to fill the polymers in the microgrooves 14 composed of the polymers, so that the polymers completely fill the gap between the chips to form flexible connections of the plurality of chips.

Figure 8:
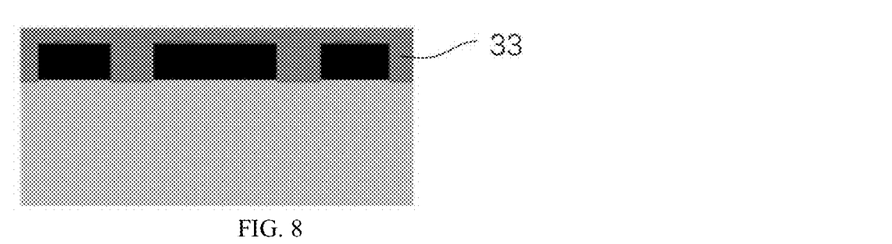
FIG. 8 illustrates a cross-section schematic diagram of polymers between chips during the implementation of the method according to the present disclosure.

Referring to FIG. 8, FIG. 8 illustrates a cross-section schematic diagram of polymers between chips during the implementation of the method according to the present disclosure. As shown in FIG. 8, after the polymers are filled between the chips twice in the above steps, the polymers connecting the chips is obtained, and a tight flexible connection between the plurality of chips is formed. At the same time, the polymer is also formed on the front surfaces of the chips, the polymers connecting the chips and the polymers on the upper surface of the front side of the chips are collectively referred to as inter-chip polymer 33. The inter-chip polymers 33 forms the flexible connection between the chips and protects the front surface of the chips.

Wherein, the flexible polymers including Parylene material may be etched by oxygen plasma through plasma etching machine. Therefore, in this embodiment, oxygen plasma may be used to etch away the polymers on the front surface of the silicon-based substrate that is embedded with each chip.

Since the silicon column structures between the plurality of microgrooves are still silicon-based substrate materials and requires high processing precision, it may be removed by photolithography first and then FIRM mixed etching. Therefore, in this embodiment, the silicon column structures among the plurality of microgrooves may also be removed by means of photolithography first and then FIRM etching.

Step 4: polishing surfaces of structures filled with the polymers, to obtain flat surfaces.

In this embodiment, the surfaces of the structures refilled with the polymers may be polished by polishing with polishing liquids and polishing cloths to obtain flat surfaces.

Specifically, due to the existence of processing errors and errors of materials such as the chip adhesive glue and the chip adhesive film, the plurality of chips may not be completely flush after embedding, for example, there is a height difference of 1-2 μm. According to the characteristics of the CVD or the spin coating process, the surfaces of the prepared polymers on the chips are also not completely flat. In this embodiment, by polishing, the front surface of the polymer 33 between each chip may be made smooth and flat, which facilitates the preparation of the metal wire and improves the continuity of the metal wire. Considering that the polymer is a flexible material, in this embodiment, the polish and grind method with polishing liquids and polishing cloth is used to perform chemical mechanical polish on the front surface of the inter-chip polymer 33 of the structure in FIG. 8, which makes the polymer surface flat, to facilitate the preparation of metal wires in subsequent steps for better electrical interconnection.

Step 5: obtaining a metal wire between each chip from the flat surfaces of the structures filled with the polymers, to realize an electrical interconnection between each chip.

In an optional implementation, the step 5 includes:

step 501, etching the flat surfaces of the structures filled with the polymers, to etch out an interconnection pin between each chip.

Step 502, by using an image recognition technology, drawing an interconnection line between each interconnection pin.

Step 503, photolithographically etching out the interconnection line between each interconnection pin by using a laser direct writing lithography machine, and sputtering an interconnection metal layer.

Step 504, removing photoresists by using a metal stripping process, and obtaining the metal wire between each chip, to realize the electrical interconnection between each chip.

Figure 9:
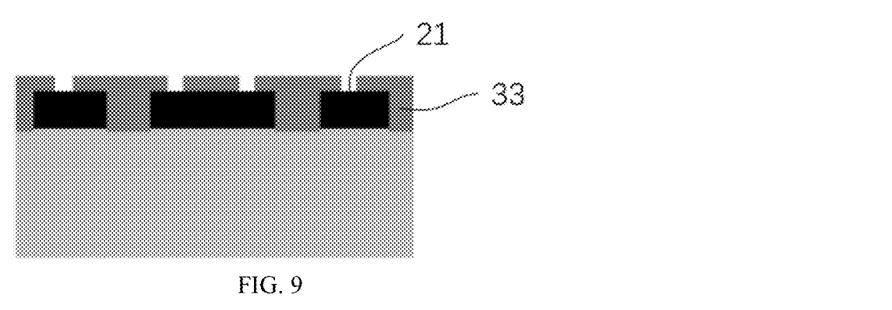
FIG. 9 illustrates a cross-section schematic diagram of an interconnection pin during the implementation of the method according to the present disclosure.

Referring to FIG. 9, FIG. 9 illustrates a cross-section schematic diagram of an interconnection pin during the implementation of the method according to the present disclosure. As shown in FIG. 9, in this embodiment, the front surface of the inter-chip polymer 33 may be etched at the positions corresponding to the chip pins by using the method of photolithography and oxygen plasma etching, to obtain the interconnection pin 21 on each chip.

Figure 10:
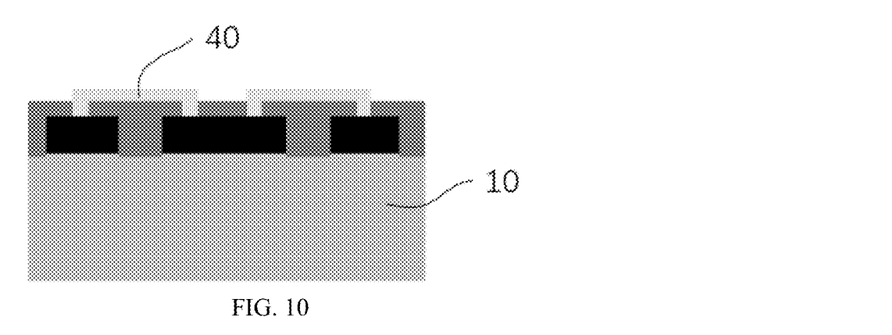
FIG. 10 illustrates a cross-section schematic diagram of a metal wire during the implementation of the method according to the present disclosure.

Referring to FIG. 10, FIG. 10 illustrates a cross-section schematic diagram of a metal wire during the implementation of the method according to the present disclosure. As shown in FIG. 10, in this embodiment, the metal wires 40 are prepared between the interconnect pins to form electrical interconnections between the chips.

Step 6: covering polymers on surfaces of structures which complete the electrical interconnections, to realize insulation protection of the electrical interconnections.

Figure 11:
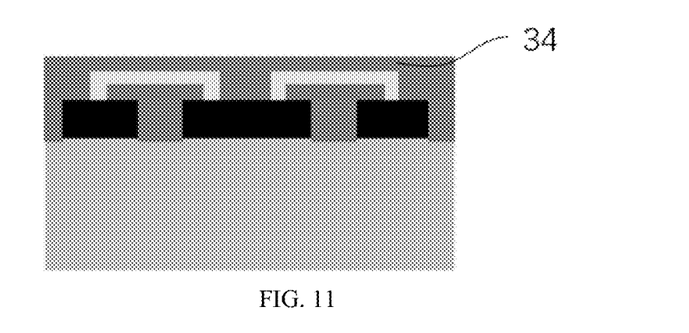
FIG. 11 illustrates a cross-section schematic diagram of a chip insulation protection during the implementation of the method according to the present disclosure.

Referring to FIG. 11, FIG. 11 illustrates a cross-section schematic diagram of a chip insulation protection during the implementation of the method according to the present disclosure. As shown in FIG. 11, in this embodiment, after the metal wires are prepared, the polymers are again prepared on the upper surface of the front side of the chips that has completed the electrical interconnection, that is, the polymer 31 on the structural surface of the electrical interconnection provides insulation protection for the electrical interconnection, and at the same time, completes the flexible wrapping of the front side of the chip.

Figure 12:
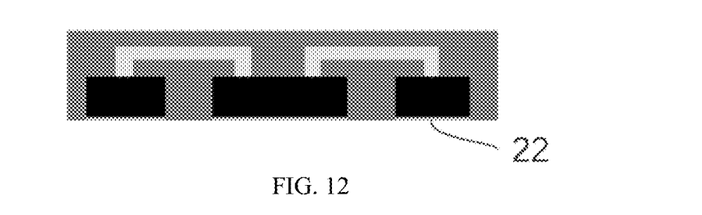
FIG. 12 illustrates a cross-section schematic diagram of a structure thinning during the implementation of the method according to the present disclosure.

Step 7: thinning from back surfaces of structures which complete the insulation protection until the chip adhesive glues or the chip adhesive films of the plurality of chips are exposed, that is, the bonding surface of the chip is visible.

Wherein the bonding surface of the chip is the bonding surface 22 between the chip 20 and the embedded groove 11.

Referring to FIG. 12, FIG. 12 illustrates a cross-section schematic diagram of a structure thinning during the implementation of the method according to the present disclosure. As shown in FIG. 12, in this embodiment, after the insulation protection and the flexible wrapping of the front surface of the chip are completed, the remaining silicon-based substrate rigid material on the back surface of the chip may be removed by physical grinding until the bonding surface 22 between the back surface of the chip and the embedded groove is exposed, that is, the chip adhesive glue or the chip adhesive film on the back surface of the chip is exposed, only the chip and the flexible polymer with electrical interconnection are remained.

Step 8: covering polymers on back surfaces of thinned structures, to perform flexible protection, and complete the processing flow of the flexible hybrid electronic system.

Figure 13:
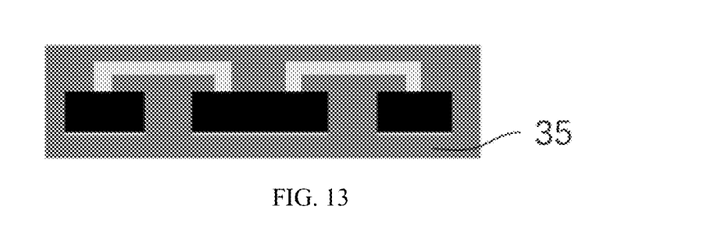
FIG. 13 illustrates a cross-section schematic diagram of a processed flexible hybrid electronic system after completing the implementation of the method according to the present disclosure.

Referring to FIG. 13, FIG. 13 illustrates a cross-section schematic diagram of a processed flexible hybrid electronic system after completing the implementation of the method according to the present disclosure. As shown in FIG. 13, in this embodiment, the polymer is finally prepared on the back surface of the chip to obtain the polymer 35 on the back surface of the structure. At this time, the electrically interconnected chips are completely wrapped by the flexible polymer, and complete electrical isolation protection is formed to complete the processing of the flexible hybrid electronic system.

According to the above embodiments, based on the method of embedding chips, the Parylene MEMS (Micro-Electro-Mechanical System) process is used to complete the flexible structural connection between the chips, and the obtained flexible features can meet the bonding requirements of most flexible hybrid systems, while the electrical performance of the finally realized flexible hybrid electronic system is comparable to that of inorganic electronics, and it is suitable for chips manufactured by any existing scale manufacturing process. The chips may use different materials and come from different tape out batches to realize the electrical interconnections of various chips, which has high flexibility and reliability, and is also conducive to the large-scale manufacturing of the flexible hybrid electronic systems. In addition, the technical solutions provided by the above embodiments may also provide solutions for flexible microsystems with the plurality of chips, and develop the flexible microsystems that include complete functions such as energy supply, sensing circuits, driving circuits, signal processing, and wireless transmission.

Due to the unavoidable processing errors, the bonding and embedding of each chip generally has a certain inclination angle, and the existence of the inclination angle makes it inconvenient for the traditional photolithography machine to directly photolithographically etching the structure filled with the polymer again. In an optional implementation, an embodiment of the present disclosure further provides a method for etching out interconnection pin between each chip, including:

step 5011, by using the image recognition technology, calculating automatically inclination angles between the plurality of chips.

In this embodiment, by using the image recognition technology, the inclination angle of the front surface of the chip relative to the flat surface of the structure filled with the polymer is calculated automatically after each chip and the embedded groove is bonded, to achieve high-accuracy electrical interconnections between the interconnect pins.

Step 5012, according to the inclination angles, performing photolithography on the flat surfaces of the structures filled with the polymers, to photolithographically etching out surface positions corresponding to the interconnection pins.

After obtaining the inclination angle of the front surface of the chip relative to the flat surface of the structure filled with the polymer after bonding each chip and the embedded groove, the position and angle of the photolithography may be adjusted according to the inclination angle, and the surface position corresponding to the interconnection pin may be obtained by the photolithography process.

Exemplarily, if the inclination angle of the front surface of the chip relative to the flat surface of the structure filled with polymer is 5°, then the etching inclination angle of the interconnection pin on the chip is also 5°.

Step 5013, by using an oxygen plasma etching, on the surface positions corresponding to the interconnection pins, deep etching the filled polymers until the interconnection pin between each chip is exposed.

In an optional implementation, an embodiment of the present disclosure further provides a method for preparing inter-chip metal wires by etching, which specifically includes the following steps:

step 1001, covering an upper surface of the polymer between the chips with a photoresist mask.

Step 1002, based on the image recognition technology, through the photoresist mask, by means of photolithography, laser directly writing interconnection lines between the interconnection pins on the upper surface of the polymer between the chips.

Step 1003, obtaining an interconnection metal layer by sputtering on an upper surface of the photoresist mask.

Step 1004, stripping and removing the photoresist mask and the metal layer on the photoresist mask, and retaining the metal wire along the interconnection line on the upper surface of the polymer between the chips, that is, obtaining the metal wire for electrical interconnection between the chips.

Through this embodiment, the position of the metal wire is obtained by the image recognition technology, the material layer of the metal wire is prepared by the metal sputtering process, and the preparation of the metal wires between the interconnection pins is completed, to realize the electrical interconnections between the chips.

As shown in FIG. 8, considering that after the step 4, the thickness of the polymer on the upper surface of the front side of the polished chip may still be too thick, in order to further make the thickness of the polymer on the upper surface of the front side of the chip easy to realize the electrical interconnection, in an optional implementation, after the step 4 and before the step 5, it also includes:

step 4': thinning structures with flat surfaces, to facilitate the subsequent use of the step 5 to realize the electrical interconnection between each chip.

Exemplarily, if the thickness of the polymer on the upper surface of the front side of the polished chip is 7 μm, but the actual required thickness of the polymer on the upper surface of the chip is 5 μm, then the polymer on the upper surface of the front side of the chip may be thinned to 5 μm.

Through this embodiment, the thickness of the polymer on the upper surface of the front side of the chip in the structure with the flat surface is reduced, and the height of the metal wire body compared with the interconnection pin of the chip is reduced, which is beneficial to the successful preparation of the metal wire at the interconnection pin. At the same time, the material cost of the metal sputtering is saved, and the structural strength of the electrical interconnection between the chips is also improved.

Considering the existence of the processing errors and the material errors, the depth of embedding the chip may also be different. For example, there is a depth difference of 1-2 μm. When thinning the silicon-based substrate on the back surface of the chip, thinning the chips at the same time may be considered. In an implementation, an embodiment of the present disclosure also provides a method for thinning the structure which completes insulation protection from the back surface, which specifically includes:

The silicon-based substrate on the back surface of the chip, part of the substrate material of the chip itself, and part of the polymer connecting the chips are removed by physical grinding, and the structure which completes the insulating protection is thinned from the back surface until the chip adhesive glues or the chip adhesive films of the chips with the smallest thickness are exposed, i.e. the bonding surface of the chip is visible.

Through this embodiment, the silicon-based substrate on the back surface of the chip and the backside structure of the chip itself are thinned at the same time, so that the thickness of the rigid structure in the finally obtained flexible hybrid electronic system is smaller, which is beneficial to the application of the flexible hybrid electronic system. However, thinning will not affect the circuits and functions on the front surface of the chip.

As shown in FIG. 13, based on the same inventive concept, an embodiment of the present disclosure further provides a flexible hybrid electronic system, the flexible hybrid electronic system is processed according to the processing method described in any of the above embodiments, a plurality of heterogeneous chips are distributed in the flexible hybrid electronic system, each of the plurality of heterogeneous chips is in the electrical interconnection, and each of the plurality of heterogeneous chips is in connection by using the polymers as flexible structures.

Finally, it should be noted that the above embodiments are only used to illustrate the technical solutions of the present disclosure, but not to limit them; although the present disclosure has been described in detail with reference to the foregoing embodiments, those of ordinary skill in the art should understand that: the technical solutions recorded in the foregoing embodiments are modified, or some of the technical features are equivalently replaced; these modifications or replacements do not cause the essence of the corresponding technical solutions to deviate from the spirit and scope of the technical solutions of the embodiments of the present disclosure.

What is claimed is:

1. A processing method of a flexible hybrid electronic system, comprising:
   step 1: etching out embedded grooves on a front surface of a silicon-based substrate, wherein a size of each of the embedded grooves is consistent with a size of a corresponding chip of a plurality of chips;
   step 2: by using chip adhesive glues or chip adhesive films, embedding and gluing the plurality of chips into the embedded grooves, wherein front surfaces of the plurality of chips embedded are flush or nearly flush with the front surface of the silicon-based substrate;
   step 3: etching and filling first polymers on a front surface of a silicon-connection structure between each of the plurality of chips embedded, to obtain a structure filled with the first polymers and realize flexible connections among the plurality of chips, wherein the silicon-connection structure is a silicon-based substrate between each of the plurality of chips embedded;
   step 4: polishing surfaces of the structure filled with the first polymers, to obtain flat surfaces of the structure filled with the first polymers;
   step 5: obtaining a metal wire between each of the plurality of chips from the flat surfaces of the structure filled with the first polymers, to obtain a structures completing the electrical interconnection and realize an electrical interconnection between each of the plurality of chips;
   step 6: covering second polymers on surfaces of the structure completing the electrical interconnection, to obtain a structure completing the insulation protection and realize an insulation protection of the electrical interconnection;
   step 7: thinning from back surface of the structure completing the insulation protection until the chip adhesive glues or the chip adhesive films of the plurality of chips are exposed, to obtain a structure thinned; and
   step 8: covering third polymers on the back surface of the structure thinned, to perform a flexible protection.

2. The processing method according to claim 1, wherein the step 1:
   etching out the embedded grooves on the front surface of the silicon-based substrate, wherein a size of each of the embedded grooves is consistent with a size of a corresponding chip of a plurality of chips, comprises:
   according to sizes of the plurality of chips to be embedded, photolithographically etching out patterns on the front surface of the silicon-based substrate for embedding the plurality of chips; and
   by using a mixed etching with a reactive ion etching (RIE) and a high ratio machining (HRM), according to thicknesses of the plurality of chips thinned, etching the patterns to obtain the embedded grooves which have consistent sizes and thicknesses with corresponding chips of the plurality of chips.

3. The processing method according to claim 1, wherein in the step 2: by using the chip adhesive glues or the chip adhesive films, embedding and gluing the plurality of chips into the embedded grooves, comprises:
   by using a glue dispenser, dropping the chip adhesive glues in a center of each of the embedded grooves, or, attaching the chip adhesive films on back surfaces of the plurality of chips; and
   by using a submicron mounter with a thermocompression bonding method, embedding and gluing the plurality of chips into the embedded grooves with the chip adhesive glues dropped in the center, or, embedding and gluing the plurality of chips with the chip adhesive films attached on the back surfaces of the plurality of chips into the embedded grooves.

4. The processing method according to claim 3, wherein by using the submicron mounter with the thermocompression bonding method, embedding and gluing the plurality of chips into the embedded grooves with the chip adhesive glues dropped in the center, or, embedding and gluing the plurality of chips with the chip adhesive films attached on the back surfaces of the plurality of chips into the embedded grooves, comprises:
   by using the submicron mounter, picking up and vacuum sucking the plurality of chips or the plurality of chips with the chip adhesive films attached on the back surfaces of the plurality of chips, and visual positioning into the embedded grooves; and
   heating a heating head of the submicron mounter to a patch temperature and applying a predetermined amount of pressure for a period of time, solidifying the chip adhesive glues or the chip adhesive films between the plurality of chips and the silicon-based substrate, and embedding and gluing the plurality of chips into the embedded grooves with the chip adhesive glues dropped in the center, or, embedding and gluing the plurality of chips with the chip adhesive films attached on the back surfaces of the plurality of chips into the embedded grooves.

5. The processing method according to claim 1, wherein the step 3:
   etching and filling the first polymers on the front surface of the silicon-connection structure between each of the plurality of chips embedded, to obtain a structure filled with the first polymers and realize the flexible connections among the plurality of chips, wherein the silicon-connection structure is a silicon-based substrate between each of the plurality of chips embedded, comprises:
   etching out a plurality of microgrooves on the front surface of the silicon-connection structure between each of the plurality of chips embedded;

filling the first polymers on the front surface of each of the plurality of chips embedded and interiors of the plurality of microgrooves;

etching away the first polymers on the front surface of the silicon-based substrate with each of the plurality of chips embedded, until silicon column structures among the plurality of microgrooves are exposed;

removing the silicon column structures among the plurality of microgrooves; and filling the first polymers again, to realize the flexible connections among the plurality of chips.

6. The processing method according to claim 5, wherein the step of etching out the plurality of microgrooves on the front surface of the silicon-connection structure between each of the plurality of chips embedded, comprises:

on the front surface of the silicon-connection structure between each of the plurality of chips embedded, by using a mixed etching with an RIE and an HRM, etching out the plurality of microgrooves with a width of 10 μm, an adjustable depth and a high aspect ratio.

7. The processing method according to claim 5, wherein the step of etching away the first polymers on the front surface of the silicon-based substrate with each of the plurality of chips embedded comprises:

by using oxygen plasmas, etching away redundant first polymers on the front surface of the silicon-based substrate with each of the plurality of chips embedded.

8. The processing method according to claim 5, wherein the step of removing the silicon column structures among the plurality of microgrooves comprises:

by using a method of photolithography first and then an HRM etching, removing the silicon column structures among the plurality of microgrooves.

9. The processing method according to claim 1, wherein the step 4:

polishing the surfaces of the structure filled with the first polymers, to obtain the flat surfaces of the structure filled with the first polymers, comprises:

by using a method of polishing with polishing liquids and polishing cloths, polishing the surfaces of the structure filled with the first polymers to obtain the flat surfaces.

10. The processing method according to claim 1, wherein the step 5:

obtaining the metal wire between each of the plurality of chips from the flat surfaces of the structure filled with the first polymers, to obtain a structures completing the electrical interconnection and realize the electrical interconnection between each of the plurality of chips, comprises:

etching the flat surfaces of the structures filled with the first polymers, to etch out an interconnection pin between each of the plurality of chips;

by using an image recognition technology, drawing an interconnection line between the interconnection pin;

photolithographically etching out the interconnection line between the interconnection pin by using a laser direct writing lithography machine, and sputtering an interconnection metal layer; and removing photoresists by using a metal stripping process, and obtaining the metal wire between each of the plurality of chips, to obtain the structures completing the electrical interconnection and realize the electrical interconnection between each of the plurality of chips.

11. The processing method according to claim 10, wherein the step of etching the flat surfaces of the structure filled with the first polymers, to etch out the interconnection pin between each of the plurality of chips, comprises:

by using the image recognition technology, calculating automatically inclination angles between the plurality of chips;

according to the inclination angles, performing photolithography on the flat surfaces of the structure filled with the first polymers, to photolithographically etching out surface positions corresponding to the interconnection pin; and by using an oxygen plasma etching, on the surface positions corresponding to the interconnection pin, deep etching the first polymers until the interconnection pin between each of the plurality of chips is exposed.

12. The processing method according to claim 1, wherein after the step 4 and before the step 5, the processing method further comprises:

step 4': thinning the structure with the flat surfaces filled with the first polymers, to facilitate a subsequent use of the step 5 to realize the electrical interconnection between each of the plurality of chips.

13. The processing method according to claim 1, wherein the plurality of chips are heterogeneous chips, the heterogeneous chips are prepared by using different materials with different tape out batches, and the heterogeneous chips have sizes and thicknesses.

14. A flexible hybrid electronic system, wherein the flexible hybrid electronic system is processed according to the processing method according to claim 1, a plurality of heterogeneous chips are distributed in the flexible hybrid electronic system, each of the plurality of heterogeneous chips is in the electrical interconnection, and each of the plurality of heterogeneous chips is in the flexible connection by using the first polymers as flexible structures.

* * * * *